US010090063B2

(12) United States Patent
Erickson et al.

(10) Patent No.: US 10,090,063 B2
(45) Date of Patent: Oct. 2, 2018

(54) SYSTEM FOR TESTING CHARGE TRAP MEMORY CELLS

(71) Applicant: International Business Machines Corporation, Armonk, NY (US)

(72) Inventors: Karl R. Erickson, Rochester, MN (US); Phil C. Paone, Rochester, MN (US); David P. Paulsen, Inver Grove Heights, MN (US); John E. Sheets, II, Zumbrota, MN (US); Gregory J. Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/427,136

(22) Filed: Feb. 8, 2017

(65) Prior Publication Data
US 2017/0169904 A1 Jun. 15, 2017

Related U.S. Application Data

(62) Division of application No. 14/963,574, filed on Dec. 9, 2015, now Pat. No. 9,666,305.

(51) Int. Cl.
*G11C 11/419* (2006.01)
*G11C 29/50* (2006.01)
(Continued)

(52) U.S. Cl.
CPC .......... *G11C 29/50004* (2013.01); *G11C 7/12* (2013.01); *G11C 7/18* (2013.01);
(Continued)

(58) Field of Classification Search
CPC ........ G11C 11/419; G11C 7/12; G11C 11/412
(Continued)

(56) References Cited

U.S. PATENT DOCUMENTS 4,698,589 A 10/1987 Blankenship et al.
5,731,733 A 3/1998 Denham
(Continued)

FOREIGN PATENT DOCUMENTS

CN 100368814 C 2/2008

OTHER PUBLICATIONS

US Non-Provisional Application entitled "Non-Volatile Memory Sense Circuit", U.S. Appl. No. 14/574,462 filed Dec. 18, 2014, 15 pp.

(Continued)

*Primary Examiner* — Jason Lappas
(74) *Attorney, Agent, or Firm* — Patterson + Sheridan, LLP

(57) ABSTRACT

A circuit for testing a memory includes a complementary charge trap memory cell, which includes a first transistor and a second transistor. A logical value of the cell corresponds to respective states of the first transistor and the second transistor. The circuit further includes a first bitline coupled to the first transistor, where the first transistor is configured to apply a first voltage to the first bitline. The circuit includes a second bitline coupled to the second transistor, where the second transistor is configured to apply a second voltage to the second bitline. The circuit also includes a sense circuit configured to output, prior to programming of the complementary charge trap memory cell, a logical high signal or a logical low signal in response to the first voltage on the first bitline and the second voltage on the second bitline.

20 Claims, 4 Drawing Sheets

(51) Int. Cl.
   *G11C 7/18*   (2006.01)
   *G11C 7/12*   (2006.01)
   *G11C 11/412* (2006.01)
   *G11C 29/12*  (2006.01)

(52) U.S. Cl.
   CPC ........... *G11C 11/412* (2013.01); *G11C 11/419* (2013.01); *G11C 2029/1202* (2013.01); *G11C 2029/1204* (2013.01); *G11C 2029/5004* (2013.01)

(58) Field of Classification Search
   USPC ............................... 365/190, 181, 202, 196
   See application file for complete search history.

(56) References Cited

U.S. PATENT DOCUMENTS

| | | | |
|---|---|---|---|
| 6,185,705 | B1 | 2/2001 | Cutter et al. |
| 6,373,762 | B2 | 4/2002 | Morgan |
| 6,541,983 | B2 | 4/2003 | Khoury |
| 6,806,107 | B1 | 10/2004 | Wu |
| 7,145,346 | B2 | 12/2006 | Chung et al. |
| 2015/0138868 | A1* | 5/2015 | Castalino ............... G11C 17/18 365/104 |

OTHER PUBLICATIONS

US Patent Application entitled "System Testing Charge Trap Memory Cells", U.S. Appl. No. 14/963,574 filed Dec. 9, 2015.
Filed Dec. 9, 2015, U.S. Appl. No. 14/963,574, Karl R. Erickson.

* cited by examiner

SYSTEM FOR TESTING CHARGE TRAP MEMORY CELLS

CROSS-REFERENCE TO RELATED APPLICATIONS

This application is a divisional of co-pending U.S. patent application Ser. No. 14/963,574, filed Dec. 9, 2015 and entitled "SYSTEM FOR TESTING CHARGE TRAP MEMORY CELLS", which is herein incorporated by reference in its entirety.

FIELD OF THE DISCLOSURE

The present disclosure relates generally to computing systems, and more particularly, to circuitry for testing charge trap memory.

BACKGROUND

A charge trap memory may include charge trap memory cells, each having two or more transistors. The charge trap memory may be coupled to a sense circuit to generate outputs corresponding to the logical states of the charge trap memory cells during a read operation.

The logical state of a particular charge trap memory cell may be based on the respective states of its transistors. The transistors may be associated with respective voltage thresholds, and differences between the respective voltage thresholds may exist due to certain imperfections in manufacturing of the transistors. Prior to programming of the particular charge trap memory cell, the magnitudes of the differences in the voltage thresholds may be unknown and/or undetectable. Because the respective voltage thresholds correspond to the states of the transistors, and because their differences in magnitude are unknown prior to programming, the logical state of the particular charge trap memory cell is also unknown prior to programming. As a result, without a known logical state of the particular charge trap memory cell, testing the output of the sense circuit may be difficult.

SUMMARY OF THE DISCLOSURE

A circuit for testing a memory includes a complementary charge trap memory cell. The complementary charge trap memory cell includes a first transistor and a second transistor, and a logical value of the cell corresponds to respective states of the first transistor and the second transistor. The circuit further includes a first bitline coupled to the first transistor, where the first transistor is configured to apply a first voltage to the first bitline. The circuit includes a second bitline coupled to the second transistor, where the second transistor is configured to apply a second voltage to the second bitline. The circuit also includes a sense circuit configured to output, prior to programming of the complementary charge trap memory cell, a logical high signal or a logical low signal in response to the first transistor applying the first voltage to the first bitline and the second transistor applying the second voltage to the second bitline.

According to another embodiment, a method includes applying a first voltage to a first bitline via a first transistor of a charge trap memory cell. The method also includes applying a second voltage to a second bitline via a second transistor of the charge trap memory cell. The method further includes outputting, prior to programming of the charge trap memory cell, a logical high signal or a logical low signal in response to applying the first voltage to the first bitline and the second voltage to the second bitline.

According to another embodiment, a computer-readable storage device includes computer-executable instructions, that when executed by at least one processor, causes the at least one processor to perform operations. The operations include applying a first voltage to a first bitline via a first transistor of a charge trap memory cell. The operations also include applying a second voltage to a second bitline via a second transistor of the charge trap memory cell. The operations further include outputting, prior to programming of the charge trap memory cell, a logical high signal or a logical low signal in response to applying the first voltage to the first bitline and the second voltage to the second bitline.

DETAILED DESCRIPTION

Figure 1:
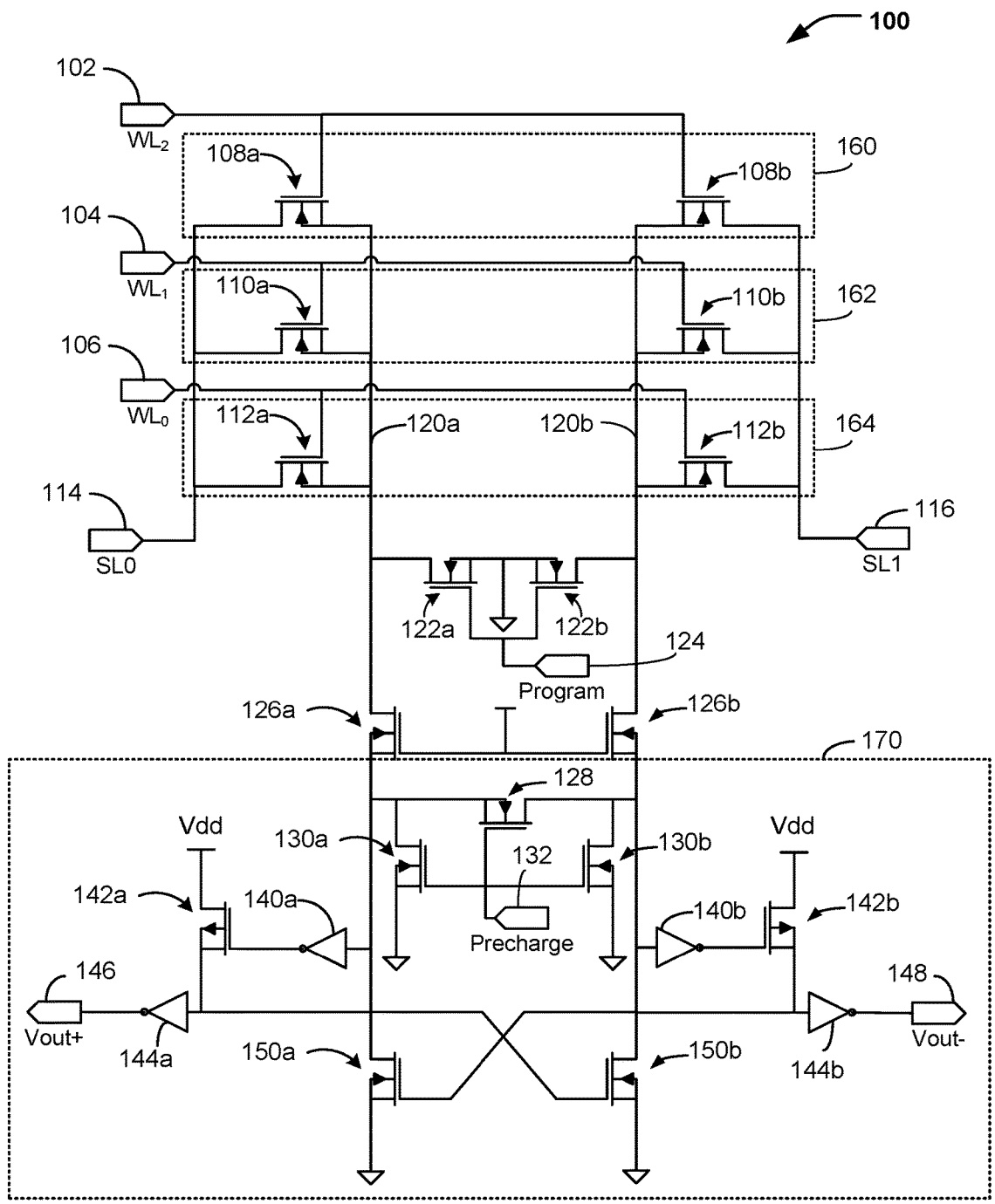
FIG. 1 is a block diagram showing a system for testing charge trap memory cells, according to one embodiment.

In the present disclosure, an embodiment of a system for testing operation of a charge trap memory is disclosed. The system may include the charge trap memory, which may include a plurality of charge trap memory cells. Further, each charge trap memory cell may include two or more transistors. The system may also include a sense circuit coupled to one or more of the charge trap memory cells, such as via one or more bitlines. The sense circuit may be configured to generate, for each charge trap memory cell that is being read, an output signal corresponding to the logical state of the charge trap memory cell. For instance, if a read operation is initiated for a particular charge trap memory cell and its logical state is a logical high, the sense circuit may be configured to generate an output signal that corresponds to the logical high of the particular charge trap memory cell.

Prior to programming of the particular charge trap memory cell of the charge trap memory, the logical state of the particular charge trap memory cell may be unknown. For instance, due to imperfections during manufacturing, there may be differences between respective voltage thresholds associated with the transistors in the particular charge trap memory cell. However, the differences between the voltage thresholds may be unknown prior to programming of the particular charge trap memory cell. The voltage thresholds affect the state of the transistors. As a result, the logical state of the particular charge trap memory cell may be unknown. Consequently, testing an output signal of the sense circuit may be difficult because the output signal cannot be compared against a known logical state of the particular charge trap memory cell.

According to a particular embodiment, a particular complementary charge trap memory cell may include a first transistor and a second transistor. Further, the logical value of the particular complementary charge trap memory cell may correspond to respective states of the first transistor and the second transistor. For instance, the logical value of the particular complementary charge trap memory cell may represent a logical high in response to the state of the first transistor being a logical low and the state of the second transistor being a logical high. Conversely, the logical value of the particular complementary charge trap memory cell may represent a logical low in response to the state of the first transistor being a logical high and the state of the second transistor being a logical low. In other embodiments, the particular complementary charge trap memory cell may include more than two transistors, and the logical value of the particular complementary charge trap memory cell may correspond to the respective states of each of the transistors.

The system may further include a first bitline and a second bitline. The first bitline may be coupled to the first transistor, and the second bitline may be coupled to the second transistor. A first power supply node may be configured to provide a first voltage to the first transistor, which may be configured to apply the first voltage to the first bitline. A second power supply node maybe configured to provide a second voltage to the second transistor, and the second transistor may be configured to apply the second voltage to the second bitline. The first voltage may be different than the second voltage.

Providing different voltages to the first transistor and the second transistor (e.g., applying the first voltage and the second voltage, respectively) may cause the particular complementary charge trap memory cell to evaluate to a known state (e.g., a logical high or a logical low). For example, by applying the first voltage and the second voltage, the first bitline may be pulled to a logical high while the second bitline may be pulled to a logical low. The corresponding logical state of the particular complementary charge trap memory cell may be a logical low. Since the logical state of the particular complementary charge trap memory cell is known to be a logical low, the output of the sense circuit may be tested to ensure that the output corresponds to the logical low.

For instance, the sense circuit may include a third transistor and a fourth transistor. The third transistor and the fourth transistor may both be larger (e.g., physically larger) than both the first transistor and the second transistor of the particular charge trap memory cell. The third transistor may be configured to pull the first bitline to a ground voltage in response to a voltage of the second bitline satisfying a voltage threshold associated with the third transistor. Conversely, the fourth transistor may be configured to pull the second bitline to a ground voltage in response to a voltage of the first bitline satisfying a voltage threshold associated with the fourth transistor.

According to a particular embodiment, the first voltage applied to the first transistor may be greater than or equal to the voltage threshold associated with the fourth transistor, and the second voltage that is applied to the second transistor may be less than the voltage threshold associated with the third transistor. As a result, the first transistor may apply the first voltage to the first bitline, which may activate the fourth transistor, and the fourth transistor may pull the second bitline to ground.

An output of the sense circuit may be compared with the known state of the complementary charge trap memory cell to test operation of the sense circuit. For instance, if the known state of the complementary charge trap memory cell corresponds to a logical high, the output of the complementary charge trap memory cell may be evaluated to ensure that an output voltage of the output also corresponds to a logical high.

FIG. 1 illustrates a particular embodiment of a system 100 for testing a charge trap memory. The system 100 may include one or more complementary charge trap memory cells 160, 162, and 164. It will be appreciated that while three complementary charge trap memory cells 160, 162, and 164 are illustrated, the system may include fewer or more complementary charge trap memory cells in other embodiments. Each of the complementary charge trap memory cells 160, 162, and 164 may include a pair of transistors. For instance, charge trap memory cell 160 may include transistor 108a and transistor 108b, charge trap memory cell 162 may include transistor 110a and transistor 110b, and charge trap memory cell 164 may include transistor 112a and transistor 112b. It will be appreciated that in other embodiments, each of the complementary charge trap memory cells 160, 162, and 164 may include more than two transistors.

Further, each of the complementary charge trap memory cells 160, 162, and 164 may be coupled to a corresponding wordline. For instance, wordline 102 may be coupled to transistor 108a and transistor 108b of complementary charge trap memory cell 160. Similarly, wordline 104 may be coupled to transistor 110a and transistor 110b of complementary charge trap memory cell 162, and wordline 106 may be coupled to transistor 112a and transistor 112b of complementary charge trap memory cell 164. Additionally, a first power supply node 114 may be coupled to transistors 108a, 110a, and 112a, and a second power supply node 116 may be coupled to transistors 108b, 110b, and 112b. Further, a first bitline 120a may be coupled to transistors 108a, 110a, and 112a, and a second bitline 120b may be coupled to transistors 108b, 110b, and 112b.

The complementary charge trap memory cells 160, 162, and 164 may be programmed in response to a programming indication received by the system 100. For example, in order to select a transistor for programming from transistors 108a, 110a, 112a, 108b, 110b, and/or 112b, the program driver 124 may activate transistors 122a and 122b, which may pull the first bitline 120a and the second bitline 120b down to a ground voltage. Further, in order to program the selected transistor, a voltage may be applied to a corresponding power supply node (e.g., the first power supply node 114 or the second power supply node 116). Additionally, a corresponding wordline (e.g., WL2 102, WL1 104, or WL0 106) may be activated to program the selected transistor. For example, in order to program transistor 110a, the program driver 124 may cause the first bitline 120a and the second bitline 120b to be pulled to the ground voltage. A voltage (e.g., a programming voltage) may be applied to the first power supply node 114, and WL1 104 may be activated, which may cause current to flow through transistor 110a. The current through transistor 110a may cause the transistor 110a to be programmed (e.g., a charge may be stored by transistor 110a). In certain embodiments, the programming of transistor 110a may cause a reading of the complementary charge trap memory cell 162 to correspond to a logical bit value of 1 or a logical high.

Additionally, transistors 126a and 126b may be configured to protect the sense circuit 170 from relatively high voltage during programming of the complementary charge trap memory cells 160, 162, and 164. Further, it will be appreciated that particular voltage and/or the second particular voltage may be the same or different than voltages that may be applied by the first power supply node 114 or the second power supply node 116 during read operations and/or test configuration operations, as described below. Moreover, in certain implementations, the particular voltage may be the same as the second particular voltage.

According to a particular embodiment, a sense circuit 170 may be coupled to the complementary charge trap memory cells 160, 162, and 164, such as via the first bitline 120a and the second bitline 120b. The sense circuit 170 may also include a pair of cross-coupled transistors, such as transistor 150a and transistor 150b. In certain implementations, transistor 150a and transistor 150b may be field-effect transistors (FETs). Further, the source/drain of transistor 150a may be coupled to the first bitline 120a while the gate of transistor 150a may be coupled to the second bitline 120b. Conversely, the source/drain of transistor 150b may be coupled to the second bitline 120b while the gate of transistor 150b may be coupled to the first bitline 120a. As such, transistor 150a may be configured to pull the first bitline 120a to a ground voltage in response to a second bitline voltage corresponding to the second bitline 120b satisfying a voltage threshold associated with transistor 150a. Similarly, transistor 150b may be configured to pull the second bitline 120b to a ground voltage in response to a first bitline voltage corresponding to the first bitline 120a satisfying a voltage threshold associated with transistor 150b. Further, the voltage threshold associated with transistor 150a may be the same or approximately the same as the voltage threshold associated with transistor 150b. In addition, both transistor 150a and transistor 150b may be larger than each of the transistors included in the complementary charge trap memory cells 160, 162, and 164 (e.g., transistors 108a, 108b, 110a, 110b, 112a, and 112b).

During a normal read operation (e.g., a read operation that is performed while the system 100 is not in a test configuration state), a memory cell (e.g., memory cells 160, 162, or 164) may be selected for reading. A wordline (e.g., wordlines 102, 104, or 106) corresponding to the memory cell may be activated and a voltage may be applied to the transistors included in the memory cell. Applying the voltage may cause the transistors to be activated, thereby causing the voltage corresponding to the first bitline 120a and the voltage corresponding to the second bitline 120b to begin increasing. In response to the increases of the voltages corresponding to the first bitline 120a and the second bitline 120b, the sense circuit 170 may cause one of the first bitline 120a or the second bitline 120b to be pulled to a logical low and may cause the other bitline to be pulled to a logical high.

For instance, complementary charge trap memory cell 162 (hereinafter "memory cell" 162) may be selected for reading. Depending on the logical state of the memory cell 162, either transistor 110a or transistor 110b may store a charge. According to a particular embodiment, if transistor 110a stores a charge and transistor 110b does not store a charge, the logical state of the memory cell 162 is a logical high. Conversely, if transistor 110a does not store a charge and transistor 110b stores a charge, the logical state of the memory cell 162 is a logical low.

Figure 2:
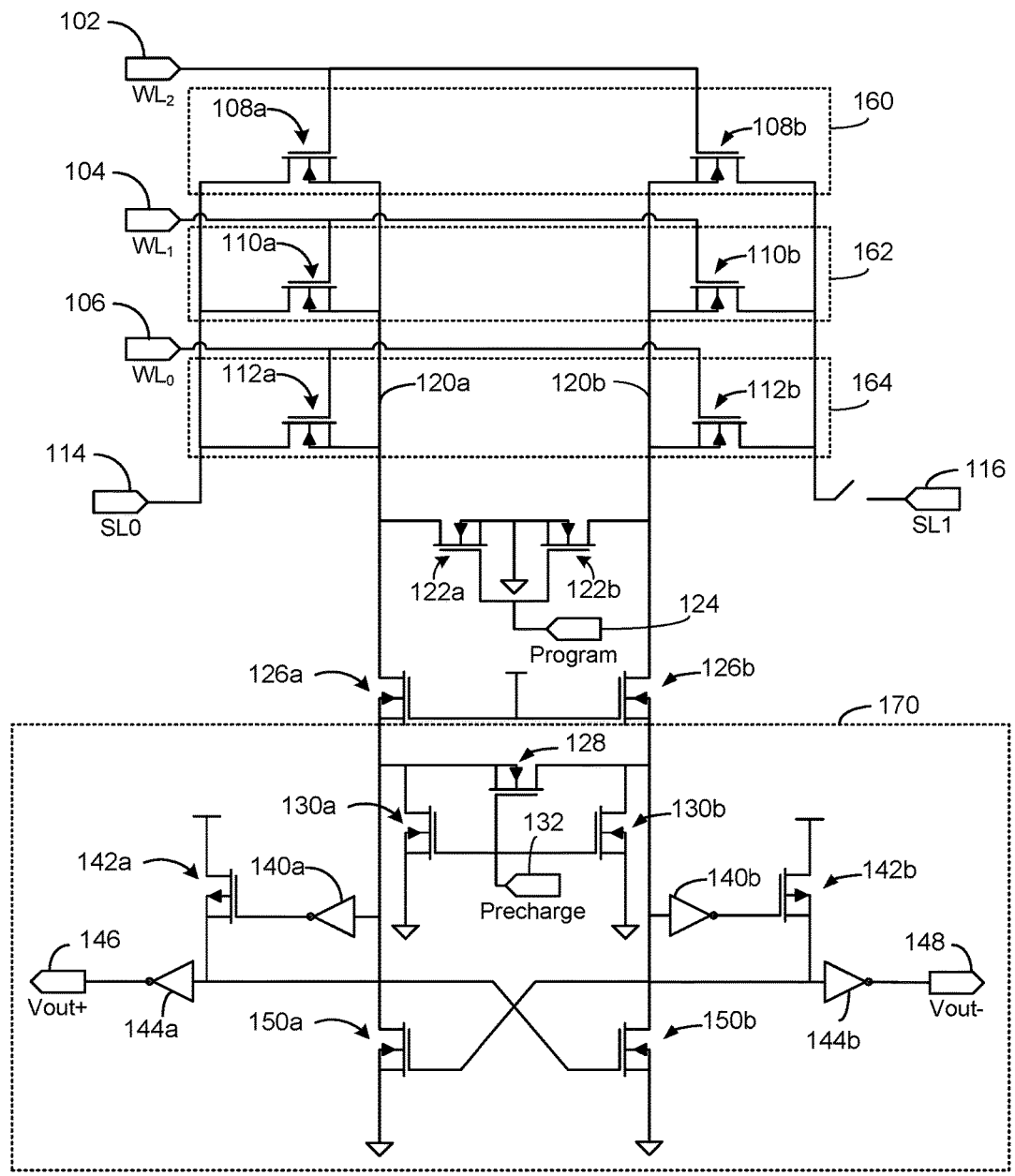
FIG. 2 is a block diagram showing another particular embodiment of a system for testing charge trap memory cells.

In order to select memory cell 162 for the normal read operation, a voltage (e.g., Vdd) may be applied to both transistors 110a and 110b. The voltage applied to wordline 104 may be associated with a wordline slew corresponding to a rate of voltage change over time. For example, the wordline slew may cause the voltage applied to the wordline 104 to increase from 10% Vdd to 90% Vdd in about 200-800 picoseconds. According to a particular embodiment, during a normal read operation, Vdd may be supplied by the first power supply node 114. As such, during the normal read operation, the first power supply node 114 may be coupled to both transistors 110a and 110b, such as via a switch (not pictured). For instance, FIG. 2 depicts a circuit diagram representation of the system 100 during the normal read operation where the first power supply node is coupled to both transistors 110a and 110b. According to another particular embodiment, during the normal read operation, Vdd may be independently supplied by the first power supply node 114 and the second power supply node 116.

Applying the voltage to transistors 110a and 110b may activate transistors 110a and 110b. Activation of transistor 110a may cause a voltage corresponding to the first bitline 120a to increase toward Vdd. Similarly, activation of transistor 110b may cause a voltage corresponding to the second bitline 120b to increase toward Vdd. Further, since transistor 110a is storing charge and transistor 110b is not storing charge, the voltage threshold corresponding to transistor 110a may be larger than the voltage threshold corresponding to transistor 110b. Therefore the voltage, changing at a rate based on the wordline slew, reaches the threshold voltage of transistor 110b before reaching the threshold voltage of transistor 110a, which causes the voltage corresponding to the second bitline 120b to begin increasing toward Vdd before the voltage corresponding to the first bitline 120a begins increasing.

Since the voltage corresponding to the second bitline 120b begins increasing before the voltage corresponding to the first bitline 120a begins increasing, and the respective voltage thresholds of transistors 150a and 150b are equal or approximately equal, transistor 150a is activated before transistor 150b can be activated. Activation of transistor 150a may cause the first bitline 120a to be pulled to a ground voltage (e.g., due to transistor 150a being larger than transistor 110a). Because the first bitline 120a is pulled to ground, the first bitline 120a is unable to activate transistor 150b, and transistor 150b remains inactivated. As a result, the first bitline 120a is pulled to a logical low (e.g., the ground voltage), and the second bitline 120b is allowed to eventually be pulled to a logical high (e.g., Vdd). Furthermore, inverter 144a may reverse the logical low of the first bitline 120a and cause the output node 146 of the sense circuit 170 to evaluate to a logical high, and inverter 144b may reverse the logical low of the second bitline 120b and cause the complementary output node 148 of the sense circuit 170 to evaluate to a logical low. The logical state of the output node 146 may correspond to the logical state of the memory cell 162.

Additionally, inverters 140a and 140b may be configured to pull the faster rising bitline to a voltage of the Vdd rail. Using the example above, since the voltage corresponding to the second bitline 120b increases faster than the voltage corresponding to the first bitline 120a, inverter 140b pulls the second bitline 120b to the voltage of the Vdd rail by reversing the logical high of the second bitline 120b to a logical low. The logic low output of the inverter 140b may activate transistor 142b, which may cause the voltage corresponding to the second bitline 120b to be pulled to the voltage of the Vdd rail. Conversely, in situations where the voltage corresponding to the first bitline 120a increase faster than the voltage corresponding to the second bitline 120b, inverter 140a pulls the first bitline 120a to the voltage of the Vdd rail by reversing a logical high of the first bitline 120a to a logical low. The logic low output of the inverter 140a may activate transistor 142a, which may cause the voltage corresponding to the first bitline 120a to be pulled to the voltage of the Vdd rail.

According to a particular embodiment, the sense circuit 170 may be tested prior to programming of the complementary charge trap memory cells 160, 162, and 164. As such, before programming, the logical state of the complementary charge trap memory cells 160, 162, and 164 may be unknown. For instance, due to certain imperfections in fabrication and/or manufacturing, there may be variations in the respective voltage thresholds of the transistors in the complementary charge trap memory cells 160, 162, and 164 (e.g., transistors 108a, 108b, 110a, 110b, 112a, and 112b). Such variations may also be unknown or difficult to determine prior to programming of the complementary charge trap memory cells 160, 162, and 164. Thus, since the respective voltage thresholds are used to determine the logical states of the complementary charge trap memory cells 160, 162, and 164, the logical states of the complementary charge trap memory cells 160, 162, and 164 are also unknown prior to being programmed.

Thus, the system 100 of FIG. 1 may be configured to cause one or more of the complementary charge trap memory cells 160, 162, and 164 to evaluate to a known logical state prior to being programmed. The known logical state may then be compared against an output of the sense circuit 170. According to a particular embodiment, in order to initiate a testing operation of the sense circuit 170, the system 100 may receive a test configuration indication indicating that the system 100 is in a testing operation mode. For example, the signal may be received from a memory controller or any other device. In response to the testing operation mode, the first bitline 120a and the second bitline 120b may be precharged to a ground voltage, such as via a precharge signal node 132. Further, the first power supply node 114 may be configured to provide a first voltage to the first bitline 120a and the second power supply node 116 may be configured to provide a second voltage to the second bitline 120b. A third voltage may be applied to a wordline corresponding to a particular complementary charge trap memory cell that is to be read during testing. The third voltage may activate a first transistor and a second transistor in the particular complementary charge trap memory cell.

As a result, upon activation, the first transistor may be configured to pull the voltage corresponding to the first bitline 120a toward the first voltage. Similarly, the second transistor may be configured to pull the voltage corresponding to the second bitline 120b toward the second voltage. Further, the first voltage may be different from the second voltage, and the voltage difference may cause one of the first bitline 120a or the second bitline 120b to be pulled to a logical low while the other bitline is pulled to a logical high. Thus, by applying different voltages to the first bitline 120a and the second bitline 120b, a known logical state of the particular complementary charge trap memory cell can be simulated. For instance, consider a test operation in which due to the first voltage and the second voltage applied to the first bitline 120a and the second bitline 120b, respectively, the first bitline 120a is pulled to a logical low and the second bitline 120b is pulled to a logical high. Such a test operation may simulate a situation where the first transistor is storing charge and the second transistor is not storing charge (e.g., the first transistor is simulated to have a greater voltage threshold than the second transistor). The first transistor storing charge and the second transistor not storing charge may correspond to a known logical state of the particular complementary charge trap memory cell. As such, the output node 146 of the sense circuit 170 may then be tested against the known logical state of the particular complementary charge trap memory cell.

More specifically with respect to FIG. 1, according to a particular embodiment, the first bitline 120a and the second bitline 120b may be precharged to a ground voltage during testing operation of the sense circuit. For instance, precharge signal node 132 may activate transistor 128, which may be configured to balance the first bitline 120a and the second bitline 120b. The precharge signal node 132 may also activate transistor 130a and transistor 130b. Transistor 130a may be configured to pull the first bitline 120a to the ground voltage, and transistor 130b may be configured to pull the second bitline 120b to the ground voltage. Thus, the precharge signal node 132 may be configured to precharge the first bitline 120a and the second bitline 120b to the ground voltage (e.g., via transistors 130a and 130b) prior to the first power supply node 114 applying voltage to the first bitline 120a and prior to the second power supply node 116 applying voltage to the second bitline 120b.

After precharging the first bitline 120a and the second bitline 120b, the first power supply node 114 may apply a first voltage to the first bitline 120a (e.g., via at least one of transistors 108a, 110a, and 112a), and the second power supply node 116 may apply a second voltage to the second bitline 120b (e.g., via at least one of transistors 108b, 110b, and 112b). For example, the first power supply node 114 may provide the first voltage to at least one of transistors 108a, 110a, and 112a, and at least one of transistors 108a, 110a, and 112a may apply the first voltage to the first bitline 120a. Similarly, the second power supply node 116 may provide the second voltage to at least one of transistors 108b, 110b, and 112b, and at least one of transistors 108b, 110b, and 112b may apply second first voltage to the second bitline 120b To illustrate, the first voltage may be 1 Volt (V), and the second voltage may be 0V. Memory cell 160 may be selected for testing by applying a third voltage to wordline 102. Further, applying the first voltage (e.g., 1V) to the first bitline 120a and applying the second voltage (e.g., 0V) to the second bitline 120b may ensure that the second bitline 120b remains low while the first bitline 120a is eventually pulled high. For instance, transistor 108a may be activated due to the first voltage while the second voltage may be insufficient to activate transistor 108b. In other words, transistor 108a may be activated before transistor 108b is activated (e.g., since the second voltage is too low to activate transistor 108b), which may simulate a state in which transistor 108a is not storing charge and transistor 108b is storing charge, thereby corresponding to a known logical state of memory cell 160.

Further, while the second bitline 120b remains low, the first bitline 120a may be pulled high via activation of transistor 108b in memory cell 160. Due to the first bitline 120a being pulled high and the second bitline 120b remaining low, transistor 150b may be activated, and transistor 150a may remain inactivated. Activation of transistor 150b may cause the second bitline 120b to be grounded (e.g., to remain low via the ground). The grounded state (e.g., low state) of the second bitline 120b is insufficient to activate transistor 150a, which may enable the first bitline 120a to remain high. The signal of the first bitline 120a may be inverted at inverter 144a and provided to the output node 146. The output node of 146 may then be compared to the known simulated logical state of the memory cell 160 to test whether the sense circuit 170 is operating correctly.

Figure 3:
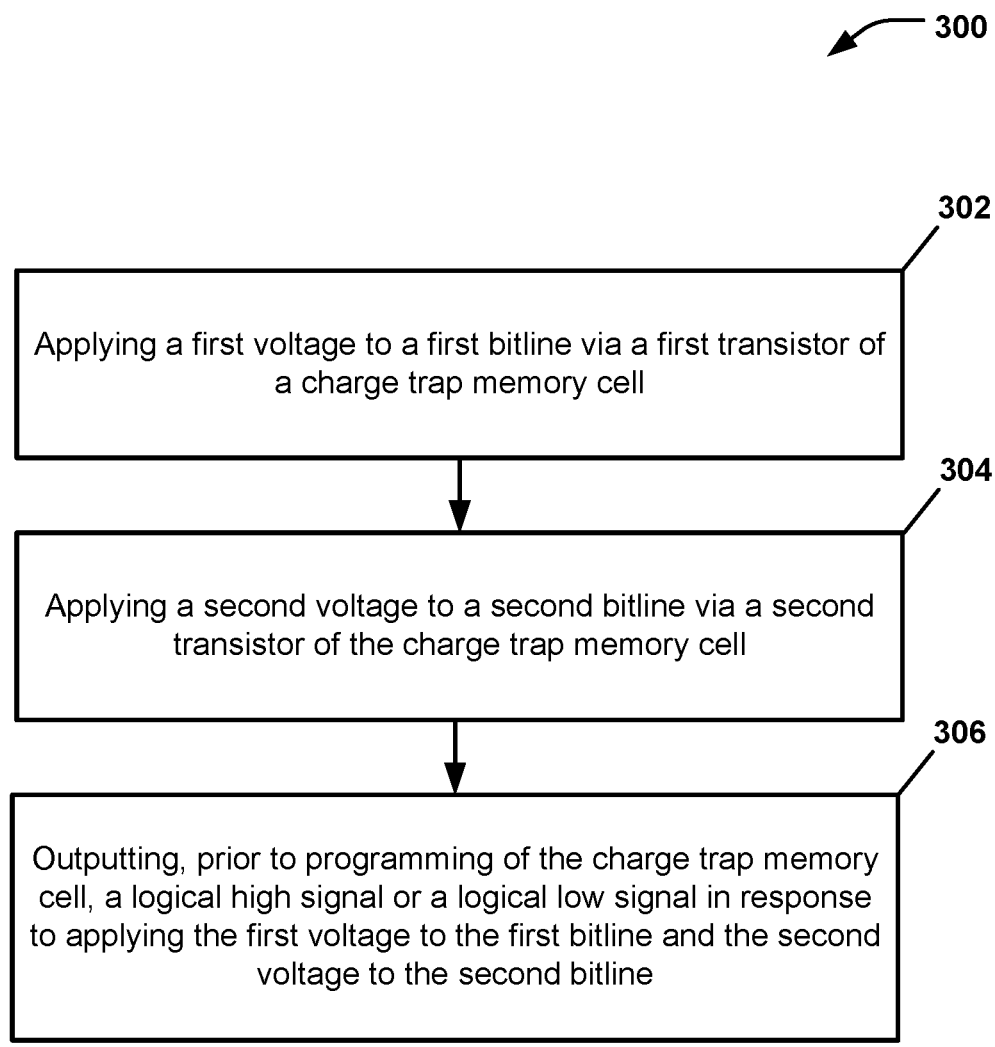
FIG. 3 is a flow diagram of a method for testing charge trap memory cells according to a particular embodiment.

FIG. 3 illustrates a method 300 for testing charge trap memory cells according to a particular embodiment. The method 300 may include applying a first voltage to a first bitline via a first transistor of a charge trap memory cell, at 302. For example, the first power supply node 114 may be configured to provide the first voltage to transistor 108a, 110a, or 112a. Transistor 108a, 110a, or 112a may be configured to apply the first voltage to the first bitline 120a.

At 304, the method 300 may include applying a second voltage to a second bitline via a second transistor of the charge trap memory cell. For example, the second power supply node 116 may be configured to provide the second voltage to transistor 108b, 110b, or 112b. Transistor 108b, 110b, or 112b may be configured to apply the second voltage to the second bitline 120b.

At 306, the method may include outputting, prior to programming of the charge trap memory cell, a logical high signal or a logical low signal in response to applying the first voltage to the first bitline and the second voltage to the second bitline. For example, applying a first voltage to the first bitline 120a and a second voltage to the second bitline 120b may cause the first bitline 120a to evaluate to a logical high or a logical low and the second bitline 120b to evaluate to the logical state opposite of the first bitline 120a. The logical state of the first bitline 120a may be output at the output node 146, which may correspond to a logical state of at least one of the charge trap memory cells 160, 162 and 164.

The system and method described by FIG. 1 and FIG. 3 may enable one or more of the charge trap memory cells 160, 162, and 164 to evaluate to a known state. As described above, by applying different voltages to the first bitline 120a and the second bitline 120b, a known logical state of a particular complementary charge trap memory cell can be simulated. If the logical state of the particular complementary charge trap memory cell is known, the output node 146 of the sense circuit 170 may be tested against the known logical state in order to reliably test the operations of the sense circuit 170, the charge trap memory cells 160, 162, and 164, and/or other components of the system 100.

Figure 4:
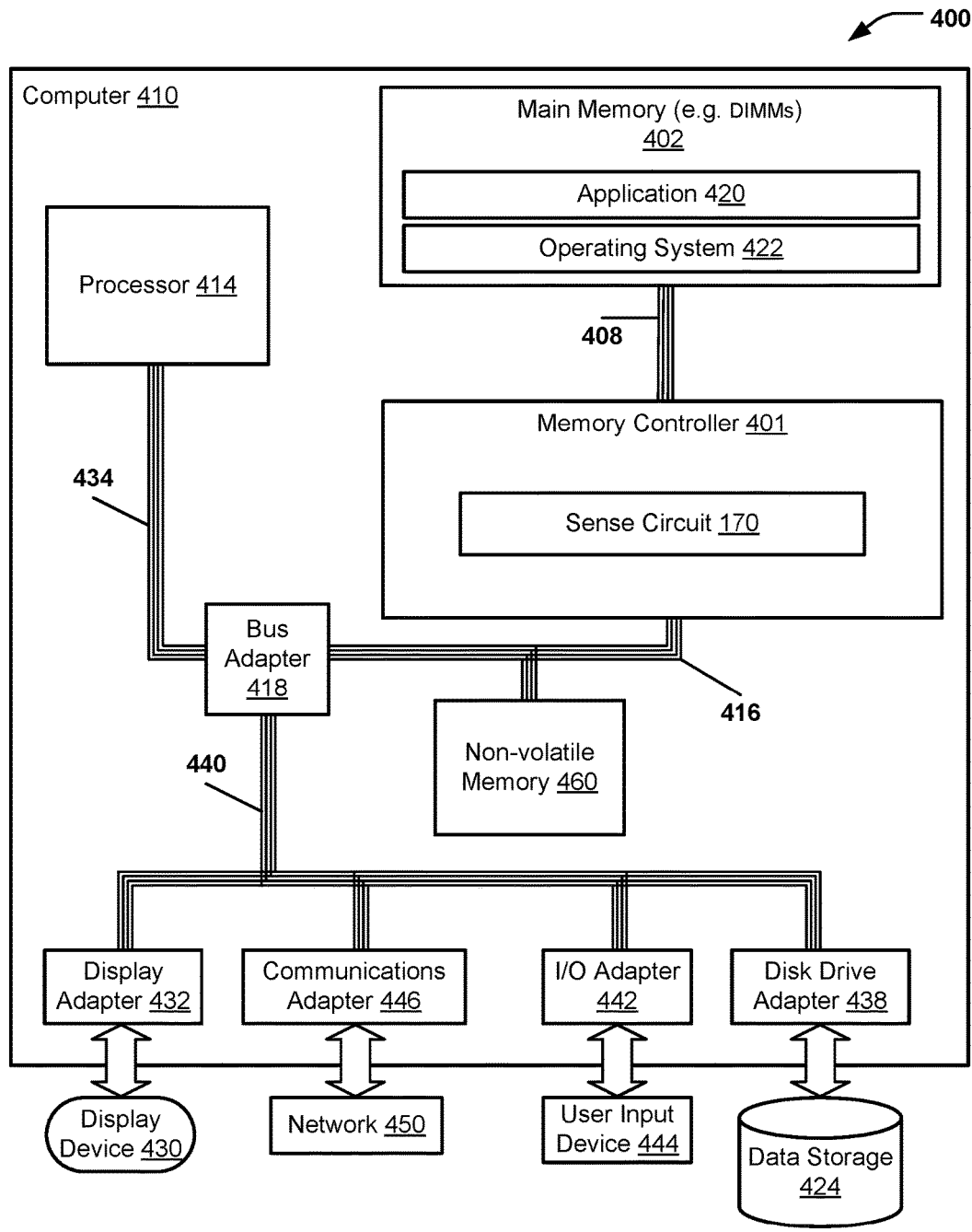
FIG. 4 is a block diagram showing a general computing system for testing charge trap memory cells according to a particular embodiment.

Referring to FIG. 4, an illustrative system 400 including a computer 410 is shown. The computer 410 may be an implementation of a computing system that includes the complementary charge trap memory system 100 of FIG. 1. The computer 410 includes at least one computer processor (CPU) 414 as well as main memory 402, a memory controller 401, and a non-volatile memory 460. At least one of the main memory 402 or the non-volatile memory 460 may include the complementary charge trap memory system 100 of FIG. 1. In some implementations, the memory controller 401 may include one or more components of the sense circuit 170 of FIG. 1. The main memory 402 is connected through a memory bus 408 to the memory controller 401. The memory controller 401 and the non-volatile memory 460 are connected through a second memory bus 416 and a bus adapter 418 to the processor 414 through a processor bus 434.

Stored at the memory 402 is an application 420 that may be a module of user-level computer program instructions for carrying out particular tasks (e.g., testing of the memory system 100). Also stored at the main memory 402 is an operating system 422. Operating systems include, but are not limited to, UNIX® (a registered trademark of The Open Group), Linux® (a registered trademark of Linus Torvalds), Windows® (a registered trademark of Microsoft Corporation, Redmond, Wash., United States), AIX® (a registered trademark of International Business Machines (IBM) Corp., Armonk, N.Y., United States) i5/OS® (a registered trademark of IBM Corp.), and others as will occur to those of skill in the art. The operating system 422 and the application 420 in the example of FIG. 4 are shown in the main memory 402, but components of the aforementioned software may also, or in addition, be stored at non-volatile memory (e.g., on data storage, such as data storage 424 and/or the non-volatile memory 460).

The computer 410 includes a disk drive adapter 438 coupled through an expansion bus 440 and the bus adapter 418 to the processor 414 and other components of the computer 410. The disk drive adapter 438 connects non-volatile data storage to the computer 410 in the form of the data storage 424 and may be implemented, for example, using Integrated Drive Electronics ("IDE") adapters, Small Computer System Interface ("SCSI") adapters, Serial Attached SCSI ("SAS") adapters, and others as will occur to those of skill in the art. Non-volatile computer memory also may be implemented as an optical disk drive, electrically erasable programmable read-only memory (so-called "EEPROM" or "Flash" memory), RAM drives, and other devices, as will occur to those of skill in the art. In a particular embodiment, the data storage 424 may store the data and information described herein.

The computer 410 also includes one or more input/output ("I/O") adapters 442 that implement user-oriented input/output through, for example, software drivers and computer hardware for controlling input and output to and from user input devices 444, such as keyboards and mice. In addition, the computer 410 includes a communications adapter 446 for data communications with a data communications network 450. The data communications may be carried out serially through Recommended Standard 232 (RS-232) connections (sometimes referred to as "serial" connections), through external buses such as a Universal Serial Bus ("USB"), through data communications networks such as internet protocol (IP) data communications networks, and in other ways as will occur to those of skill in the art. The communications adapter 446 implements the hardware level of data communications through which one computer sends data communications to another computer, directly or through a data communications network. Examples of the communications adapter 446 suitable to use in the computer 410 include, but are not limited to, modems for wired dial-up communications, Ethernet (Institute of Electrical and Electronics Engineers (IEEE) 802.3) adapters for wired network communications, and IEEE 802.11 adapters for wireless network communications. The computer 410 also includes a display adapter 432 that facilitates data communication between the bus adapter 418 and a display device 430, enabling the application 420 to visually present output on the display device 430.

Particular embodiments described herein may take the form of an entirely hardware embodiment, an entirely software embodiment, or an embodiment containing both hardware and software elements. In a particular embodiment, the disclosed methods are implemented in software that is embedded in processor readable storage medium or storage device and executed by a processor that includes but is not limited to firmware, resident software, microcode, etc.

Further, embodiments of the present disclosure, may take the form of a computer program product accessible from a computer-usable or computer-readable storage device providing program code (e.g., computer-executable instructions) for use by or in connection with a computer, processor, or any instruction execution system. For the purposes of this description, a computer-usable or computer-readable storage device can be any apparatus that can tangibly embody a computer program and that can contain, store, communicate, propagate, or transport the program for use by or in connection with the instruction execution system, processor, apparatus, or device.

In various embodiments, the medium can include an electronic, magnetic, optical, electromagnetic, infrared, or semiconductor system (or apparatus or device) or a propagation medium. Examples of a computer-readable storage device include a semiconductor or solid state memory, magnetic tape, a removable computer diskette, a random access memory (RAM), a read-only memory (ROM), a rigid magnetic disk and an optical disk. Current examples of optical disks include compact disk—read only memory (CD-ROM), compact disk—read/write (CD-R/W) and digital versatile disk (DVD).

A data processing system suitable for storing and/or executing program code may include at least one processor coupled directly or indirectly to memory elements through a system bus. The memory elements can include local memory employed during actual execution of the program code, bulk storage, and cache memories that may provide temporary or more permanent storage of at least some program code in order to reduce the number of times code must be retrieved from bulk storage during execution.

Input/output or I/O devices (including but not limited to keyboards, displays, pointing devices, etc.) can be coupled to the data processing system either directly or through intervening I/O controllers. Network adapters may also be coupled to the data processing system to enable the data processing system to become coupled to other data processing systems or remote printers or storage devices through intervening private or public networks. Modems, cable modems, and Ethernet cards are just a few of the currently available types of network adapters.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the scope of the disclosure. Thus, the present disclosure is not intended to be limited to the embodiments shown herein but is to be accorded the widest scope possible consistent with the principles and features as defined by the following claims.

The invention claimed is:

1. A non-transitory computer-readable storage device storing computer-executable instructions, that when executed by at least one processor, cause the at least one processor to perform operations comprising:
    applying a first voltage to a first bitline via a first transistor of a charge trap memory cell, wherein the first transistor is directly coupled to a first power source;
    applying a second voltage to a second bitline via a second transistor of the charge trap memory cell, wherein the second transistor is directly coupled to a second power source; and
    outputting, prior to programming of the charge trap memory cell, a logical high signal or a logical low signal in response to applying the first voltage to the first bitline and the second voltage to the second bitline.

2. The non-transitory computer-readable storage device of claim 1, further comprising applying, in response to a programming indication, a third voltage to the first bitline and to the second bitline to program one or more cells of the charge trap memory cell.

3. The non-transitory computer-readable storage device of claim 1, further comprising receiving a test configuration indication, wherein the first voltage is applied to the first bitline and the second voltage is applied to the second bitline in response to receiving the test configuration indication.

4. The non-transitory computer-readable storage device of claim 1, further comprising:
    pulling the second bitline toward a ground voltage in response to a first bitline voltage corresponding to the first bitline satisfying a first voltage threshold; and
    pulling the first bitline toward the ground voltage in response to a second bitline voltage corresponding to the second bitline satisfying a second voltage threshold.

5. The non-transitory computer-readable storage device of claim 1, further comprising:
    pulling the first bitline toward a ground voltage prior to the first transistor applying the first voltage to the first bitline; and
    pulling the second bitline toward the ground voltage prior to the second transistor applying the second voltage to the second bitline.

6. The non-transitory computer-readable storage device of claim 1, wherein the first transistor applies the first voltage to the first bitline in response to a test configuration indication.

7. The non-transitory computer-readable storage device of claim 6, wherein the second transistor applies the second voltage to the second bitline in response to the test configuration indication.

8. The non-transitory computer-readable storage device of claim 1, further comprising using a third transistor to pull the second bitline toward a ground voltage in response to a first bitline voltage corresponding to the first bitline satisfying a first voltage threshold.

9. The non-transitory computer-readable storage device of claim 8, further comprising using a fourth transistor to pull the first bitline toward the ground voltage in response to a second bitline voltage corresponding to the second bitline satisfying a second voltage threshold.

10. The non-transitory computer-readable storage device of claim 1, wherein the first transistor and the second transistor are field effect transistors.

11. The non-transitory computer-readable storage device of claim 1, further comprising coupling the first bitline to the first power supply.

12. The non-transitory computer-readable storage device of claim 11, further comprising coupling the second bitline to the second power supply.

13. The non-transitory computer-readable storage device of claim 1, further comprising using a third transistor to pull the first bitline toward a ground voltage prior to the first transistor applying the first voltage to the first bitline.

14. The non-transitory computer-readable storage device of claim 13, further comprising using a fourth transistor to pull the second bitline toward the ground voltage prior to the second transistor applying the second voltage to the second bitline.

15. The non-transitory computer-readable storage device of claim 1, further comprising coupling a first inverter to the first bitline.

16. The non-transitory computer-readable storage device of claim 15, further comprising coupling a third transistor to an output of the first inverter.

17. The non-transitory computer-readable storage device of claim 16, further comprising a third transistor to pull the first bitline up to a supply voltage in response to the output of the first inverter satisfying a first voltage threshold associated with the third transistor.

18. The non-transitory computer-readable storage device of claim 1, further comprising coupling a second inverter to the second bitline.

19. The non-transitory computer-readable storage device of claim 18, further comprising pulling the second bitline up to a supply voltage in response to an output of the second inverter satisfying a voltage threshold.

20. The non-transitory computer-readable storage device of claim 1, further comprising further comprising receiving a test configuration indication, wherein the first voltage is applied to the first bitline and the second voltage is applied to the second bitline in response to receiving the test configuration indication.

* * * * *